United States Patent [19]

Nishizawa et al.

[11] 4,408,304
[45] Oct. 4, 1983

[54] SEMICONDUCTOR MEMORY

[75] Inventors: Jun-ichi Nishizawa; Ohmi Tadahiro; Takashige Tamamushi, all of Sendai, Japan

[73] Assignee: Semiconductor Research Foundation, Japan

[21] Appl. No.: 260,297

[22] Filed: May 4, 1981

[30] Foreign Application Priority Data

May 17, 1980 [JP] Japan .................................. 55/65818

[51] Int. Cl.³ ............................................. G11C 11/40
[52] U.S. Cl. .................................... 365/174; 365/230; 357/40
[58] Field of Search ...................... 365/174, 189, 230; 357/40, 41, 45

[56] References Cited

U.S. PATENT DOCUMENTS 4,228,525 10/1980 Kawarada .......................... 365/174
4,323,986 4/1982 Malaviya ............................ 365/174

OTHER PUBLICATIONS

"Static Induction Transistor Image Sensors" by Nishizawa et al. IEEE Transactions on Electron Devices, vol. Ed.–26 No. 12 pp. 1970–1977 Dec. 1979.

*Primary Examiner*—Terrell W. Fears
*Attorney, Agent, or Firm*—McGlew and Tuttle

[57] ABSTRACT

A semiconductor memory is provided with a hook structure composed of first to fourth regions and is capable of non-destructive readout. The third and fourth regions of the hook structure are both made floating and each form one of main electrode regions of each of a write and/or refresh transistor and a readout transistor. Carriers which are injected from the other main electrode region of the write transistor are stored as excess majority carriers in the third region and majority carriers of the fourth region flow out therefrom into the first region via the third and second regions, in consequence of which the fourth region lacks in the majority carrier and voltages of the floating third and fourth regions vary. The voltage variation of the fourth region is read out by the readout transistor. The excess majority carriers stored in the third region flow out therefrom into the other main electrode region of the write transistor and become extinct when it operates as a refresh transistor.

6 Claims, 12 Drawing Figures

SEMICONDUCTOR MEMORY

BACKGROUND OF THE INVENTION

1. Field of the Invention

The present invention relates to a memory system which is provided with memory cells packed with high density and capable of non-destructive, dynamic and semi-static readout of memory information.

2. Description of the Prior Art

It is well-known in the art that semiconductor memories are roughly divided into a dynamic memory (d-RAM), a static memory (S-RAM), a read only memory (ROM) and a serial memory. The memory of the present invention is of the dynamic memory type in terms of operation. In the static memory, information of conduction and non-conduction of two flip-flop transistors is represented by digital information "0" and "1" and this information is maintained as long as the power source voltage is applied, and it can be considered that the information can be stored substantially permanently under the condition that the power source voltage is applied.

An existing 4K, 16K or 64K dynamic memory, or a 256K memory recently published in ISSCC (1980) employs a one-transistor one-capacitor type memory cell which comprises one MOSFET and one capacitor.

Generally, in the case where information (the amount of charges) stored in such a capacitor is read out by the conduction and non-conduction of one gate (word line) of the transistor serving as a switch, a voltage variation on a bit line is capacitively divided such that $\{C_S/(C_S+C_B)\}V_S$ to provide a small signal voltage, where $V_S$ is the voltage stored in the capacitor, $C_S$ is the storage capacitance of the capacitor and $C_B$ is a parasitic capacitance of the bit line. Further, in this type of memory, once the information has been read out, the charges stored in the capacitor flow out therefrom, so that a refresh operation is needed for re-writing. It is necessary to provide a circuit arrangement on the bit line so that the reduced signal voltage by the capacitive division may be amplified with high sensitivity and that the refresh operation may be achieved together with the amplifying operation. To this end, a sense amplifier is employed, which is usually of the valanced flip-flop structure. For example, in the case of forming the 16K memory by a (128×128) matrix using 128 word lines and 128 bit lines, 128 memory cells are arranged on each bit line and the sense amplifier is positioned at the center of the memory cell array; namely, 64 memory cells are disposed on either side of the sense amplifier, along with a cell which is called a dummy cell. The word line voltage is applied on the word line of the cell on one side of the sense amplifier to be read out and, at the same time it is applied on the word line of the dummy cell on the opposite side where a voltage about one-half of the power source voltage has been stored in the dummy cell. As a result of this, a memory signal is provided on the bit line and various pulses of the sense amplifier start to operate to apply this information to the gate of a flip-flop transistor and the sense amplifier performs a pulse operation so that a minute potential difference between the bit lines on both sides of the sense amplifier may be amplified by the operation of the flip-flop transistor. In the state in which the amplifying operation has once been completed, the potential of the bit line on the side of the cell in which a high-level signal has been stored is already substantially equal to the power source voltage and since the word line is in the conduction voltage level, re-write of the read out memory cell is carried out. The potential of the bit line on the side of the cells in each of which a low-level signal has been stored becomes substantially 0V ($V_S$: ground potential) and 0V is also stored in that cell. Amplified signal voltages on these bit lines are applied to an output buffer and an output circuitry to derive therefrom a data out signal. The sense amplifier equipped with such amplifying and refresh functions is disposed on each of 128 bit lines in the case of the abovesaid 16K memory.

Apart from the semiconductor dynamic memory of the one-transistor one-capacitor type in which the operating performance is dependent on the performance of such a high-sensitivity sense amplifier as described above, there is a three-transistor cell type memory represented by Model i-1103 of Intel Inc. which was used as a semiconductor memory and a main memory of a computer for the first time. FIG. 1 shows an equivalent circuit of its memory cell. The readout of this memory is non-destructive unlike in the case of the aforesaid one-transistor one-capacitor type memory. In FIG. 1, reference character $Q_1$ indicates a write MOS transistor; $Q_2$ designates a MOS transistor in the gate of which information is stored; and $Q_3$ identifies a readout transistor. During the write operation, a write select line 2 of the gate of the transisitor $Q_1$ is in the high voltage level and information from a data input line 1 is stored in a storage capacitance 5 ($C_S$) of the gate of the transistor $Q_2$. During the readout operation, a readout select line 4 of the gate of the readout transistor $Q_3$ is in the high voltage level and when the transistor $Q_2$ is in the ON state (in the state in which information is stored in the storage capacitance $C_S$), a current flows via the transistors $Q_3$ and $Q_2$, lowering the potential of a readout data line 3. When the transistor $Q_2$ is in the OFF state (in the state in which data "0" is stored in the storage capacitance $C_S$), the potential of the readout data line 3 remains high-level. The information stored in the gate of the transistor $Q_2$ decreases in the form of a leakage current flowing through the transistor $Q_1$ or in the generation-reconbination process; this information abruptly decreases in about tens of seconds. Before this decrease of the information, however, the same voltage variation is provided on the readout data line 3, no matter how many times the readout select line 4 is in the high voltage level. This is a large difference from the destructive readout operation of the aforementioned one-transistor one-capacitor type dynamic memory in which the memory content disappears when the memory information has once been read out. A large difference between the destructive readout memory and the non-destructive readout memory resides in that, in the former, information stored in a capacitor is directly read out by a current flowing through the capacitor, whereas, in the latter, a voltage stored in the capacitor is read out as voltage information. The three-transistor cell memory shown FIG. 1 calls for three transistors for storing information in one cell. This memory has the advantage that the memory content remains even after reading out the information, but it is inferior to the one-transistor cell type memory in terms of packing density and power consumption. The one-transistor cell type is superior to the three-transistor cell type in terms of large capacity. Accordingly, existing large-scale computers show a marked trend to employ the one-transistor cell type memory as a dynamic memory.

SUMMARY OF THE INVENTION

It is an object of the preset invention to provide a dynamic memory which has the feature of the nondestructive readout operation of the conventional three-transistor cell type memory but has a packing density substantially equal to that of the one-transistor cell type memory.

Another object of the present invention is to provide a dynamic memory in which information can be retained for a very long period of time.

The abovesaid objective can be achived by providing a semiconductor memory which is provided with a memory cell comprising a hook structure composed of a first region, a second region, a third region of a first conductivity type and a fourth region of a second conductivity type reverse from the first conductivity type, the first to fourth regions being sequentially formed on a semiconductor substrate in adjoining relationship to one another and the third and fourth regions being made floating; a write transistor using the third region of the hook structure as one of its main electrode regions; and a readout and/or refresh transistor using the fourth region of the hook structure as one of its main electrode regions.

In the prior art three-transistor cell memory, information is stored in a capacitor of the gate of a MOSFET but, in the memory of the present invention, excess majority carriers injected from the write transistor and stored in the third region of the hook structure are held as cell information. When the write transitor conducts to store the excess majority carriers from its one main electrode region in the other main electrode region, that is, in the floating third region of the hook structure, the potential barrier of a PN junction formed between the third and fourth regions decreases, permitting majority carriers in the fourth region to flow out towards the first region via the third and second regions. As a result of this, the fourth region lacks the majority carriers to change voltages of the fourth regions. Thereafter, upon conduction of the readout transistor using the fourth region as one of its main electrode regions, the majority carriers flow out of the other main electrode region of the readout transistor into the fourth region to yield a readout voltage. The shortage of majority carriers in the fourth region tends to be covered by the supply thereto of majority carriers which accompanies the readout operation, but, in practice, the majority carriers supplied mostly flow out from the fourth region towards the first region through the third and second regions by the same principle as mentioned previously; therefore, the shortage of majority carriers in the fourth region is not alleviated at all. The reason is that the majority carrier shortage in the fourth region comes from the storage of the excess majority carriers in the third region and that since the excess majority carriers are captured by a potential well of the hook structure, they are hardly flowed into the fourth region even by the readout operation and are still stored in the third region. To extinguish the excess majority carriers stored in the third region, the aforesaid write transistor is activated as a refresh transistor, by which the excess majority carriers stored in the third region, that is, in the one main electrode region of the refresh transistor, are caused to flow into the other main electrode region of the refresh transistor.

In this way, in the present invention the memory function is provided by two transistor for each cell. Further, in the memory of the present invention stored information can be held for a very long period of time untill the excess majority carriers stored in the third region are extinguished by recombination.

DESCRIPTION OF THE PREFERRED EMBODIMENTS

Figure 1:
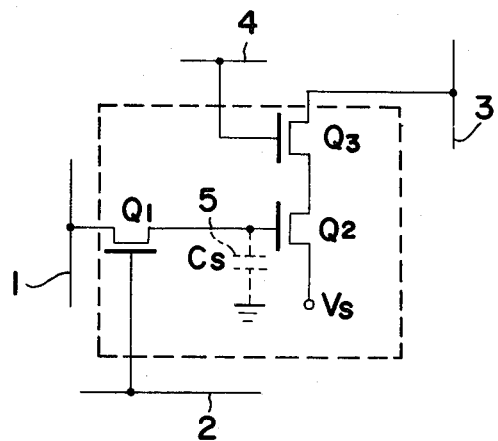
FIG. 1 shows a circuit configuration of a cell portion of a conventional three-transistor cell memory.
Figure 2A:
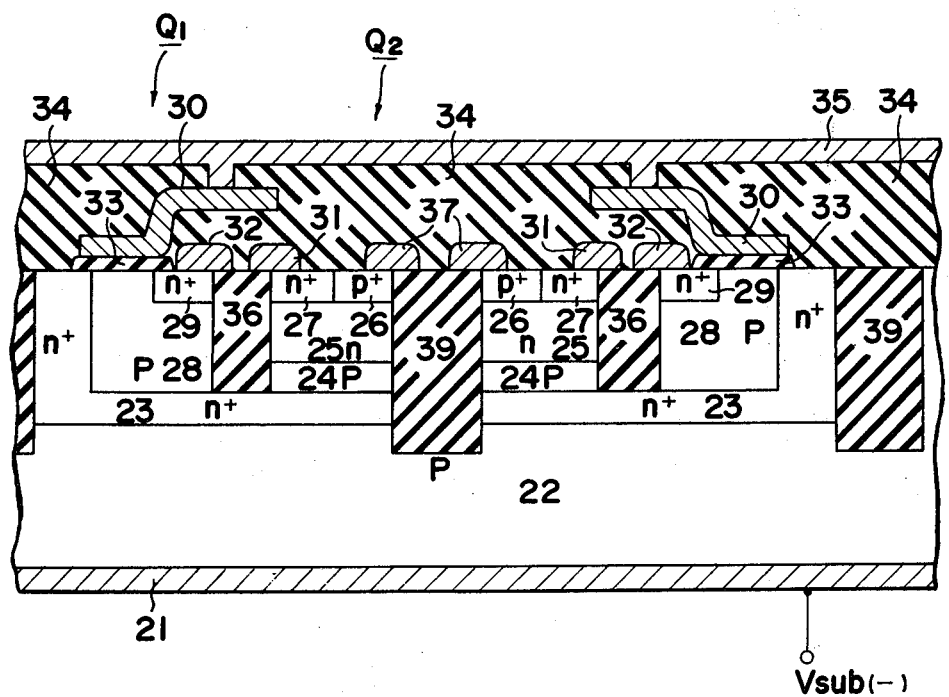
FIG. 2A is a sectional view of the memory cell structure of an embodiment of the present invention.

FIGS. 2A, B and C are respectively a sectional view of a dynamic RAM (d-RAM) cell structure of the present invention, a circuit diagram of its one cell and a waveform diagram explanatory of its operation. In FIG. 2, reference numeral 21 indicates a substrate electrode as of aluminum or doped polysilicon, to which is applied a substrate bias voltage Vsub(−); 22 designates a p type substrate; 23 identifies an n+ type floating region, which forms the drain (or source) of an n-channel MOSFET $Q_1$; 24 denotes a p type floating region, which serves as the collector region of a write and/or refresh bipolar transistor $Q_2$ (which comprises a p+ type region 26, an n+ type region 27 and the p type region 24); 25 represents an n type base region; and 26 shows a p+ type emitter region. The n+ type region 23, the p type region 24, the n type region 25 and the n+ type region 27 constitute a hook structure. That is, electrons from the n+ type region 23 pass through the n+ type region 27 and holes injected from the emitter 26 of the bipolar transistor $Q_2$ are stored in the p type region 24 which is used as a floating region. The storage of the holes causes the p type region 24 to be charged positive by $Q/C_f$, where Q and $C_f$ are the hole charge stored in the region 24 and the electrostatic capacitance of the region 24. Accordingly, electrons are injected from the n+ type region 23 towards the n+ type region 27, in consequence of which the n+ type region 23 also lacks in electrons and is charged positive.

Figure 2B:
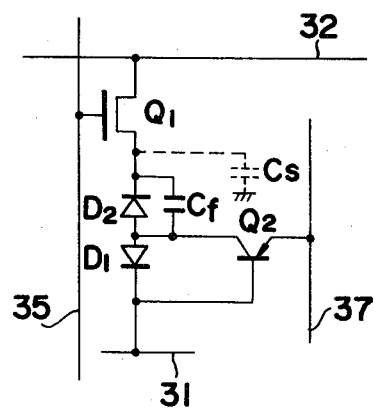
FIG. 2B is a circuit diagram of the memory cell depiched in FIG. 2A.
Figure 2C:
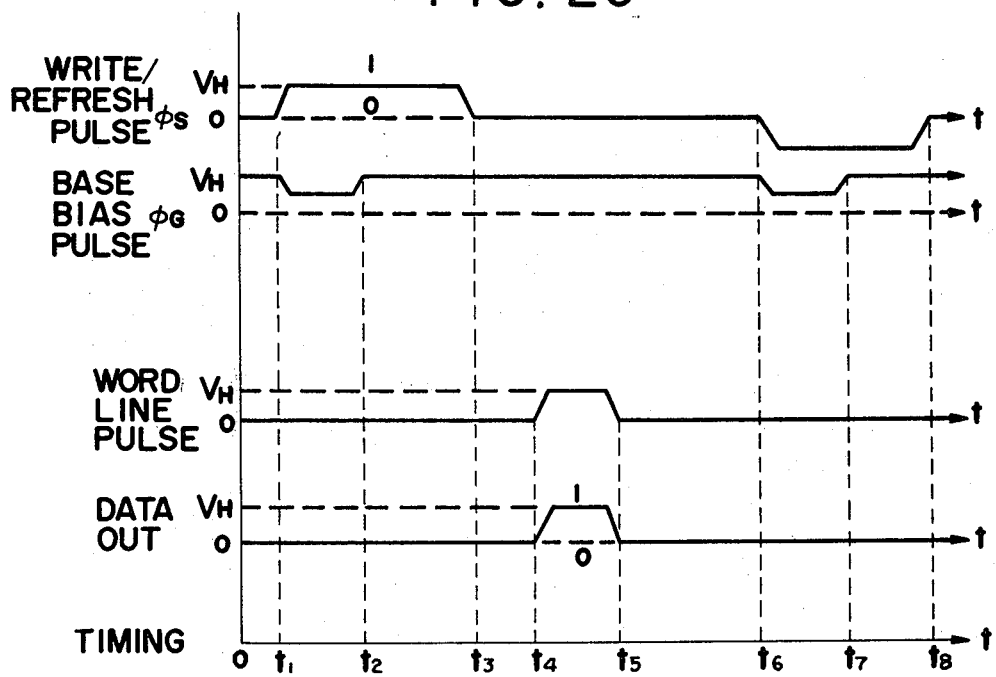
FIG. 2C is a timing chart explanatory of the operation of the memory cell shown in FIG. 2A.

Reference numeral 28 indicates a p type region, which is the channel region of the MOSFET $Q_1$; 29 designates an n+ type region which serves as the source (or drain) region of the MOSFET $Q_1$ and which is connected to a bit line 32; and 30 identifies a gate electrode of the MOSFET $Q_1$, which is connected to a word line 35. Electrodes 37 and 31 are respectively connected to the p+ type region 26 and the n+ type region 27 and supplied with pulse voltages $\phi_S$ and $\phi_G$ for write and refresh operations in such a voltage relationship as shown in FIG. 2C so that the aforesaid hook structure formed by the n+ type region 23, the p type region 24, the n type region 25 and the n+ type region 27 may perform a hook operation. In FIG. 2C, the write operation takes place in the time interval between moments $t_1$ and $t_3$, the read operation between moments $t_4$ and $t_5$ and the refresh operation between $t_6$ and $t_8$. Region 39, 36, 33 and 34 are formed of an insulator such as an oxide, nitride, polyimid or the like.

Now, a discription will be given of the operation of the dynamic RAM (d-RAM). The pulse voltage $\phi_S$ is applied to an electrode line 27, to raise its potential up to $V_H$ (for example about 5 V) and the pulse voltage $\phi_G$ is applied to the electrode line 31. As a result of this, a voltage of $V_H - 0.8$ V (for example about 4.2 V) is provided to the base of the bipolar transistor $Q_2$ to make the base potential lower than the mitter potential (between the moments $t_1$ and $t_2$). In the time interval between the moments $t_1$ and $t_2$, holes in the p+ type region 26 are injected therefrom towards the region 25 and collected in the p type region 24. Letting the amount of charges of the holes accumulated in the p type region 24 and the parasitic capacitance of the region 24 (mainly the junction capacitance between it and the n+ type region 23) be represented by Q and $C_f$, respectively, the p type region 24 is charged positive by $Q/C_f$. Accordingly, when the pulse voltage $\phi_G$ returns to $V_H$ (V) at the moment $t_2$, the injection of holes from the p+ region 26 stops and electrons in the n+ type region 23 which is made floating are injected therefrom towards the n+ type region 27 to flow into the electrode 31. In the time interval between the moments $t_2$ and $t_3$ the floating n+ type region 23 is self-biased positively by $Q'/C'_f$ (V) corresponding to the depletion of electrons in the region 23, where $Q'$ is the amount of charges in the region 23 and $C'_f$ is the electrostatic capacitance of the region 23. Be reading out this voltage onto the bit line 32 via the gate 30 of the MOSFET $Q_1$ (the word line 35), the readout operation is completed. A potential variation on the bit line in the time interval between the moments $t_4$ and $t_5$ is indicated by DATA OUT in FIG. 2C. During the readout operation, electrons flow in the n+ type region 23 from the n+ type region 29, but excess holes in an amount of Q (coulomb) are accumulated in the p type region 24 and the electrons flowing into the n+ type region 23 during the readout operation are immediately injected into the p type region 24 to flow into the n+ type region 27. Accordingly, as long as the holes are accumulated in the p type region 24, the readout is non-destructive and the voltage which is read out on the bit line is also substantially $Q'/C'_f$ (V). This voltage is not read out as a capacitively-divided value between the capacitance $C_f$ of the region 23 and that $C_B$ of the bit line; the readout operation is accomplished as if a power source voltage of $Q'/C'_f$ (V) is read out by the MOSFET $Q_1$. This is one of the features of the dynamic memory of the present invention. During the refresh operation it is sufficient to lower the potential $\phi_S$ negative, releasing the holes accumulated in the p type region 24 (moments $t_6$ to $t_8$). FIG. 2B illustrates a circuit diagram of one cell of the cell structure depicted in FIG. 2A.

Figure 3A:
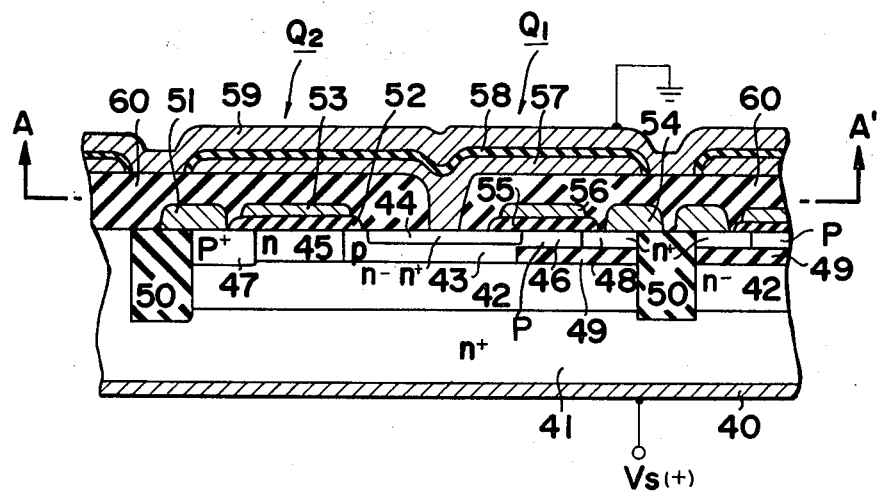
FIG. 3A is a sectional view of the memory cell structure of another embodiment of the present invention.
Figure 3B:
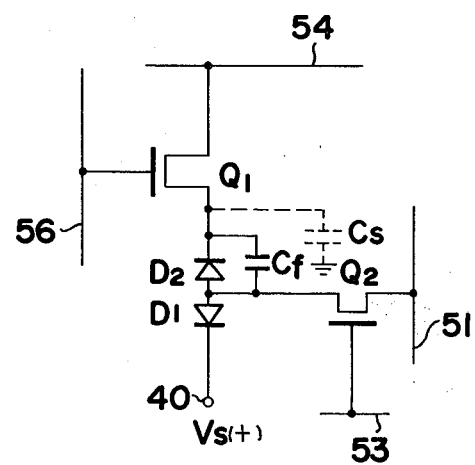
FIG. 3B is a circuit diagram of the memory cell depiched in FIG. 3A.
Figure 3C:
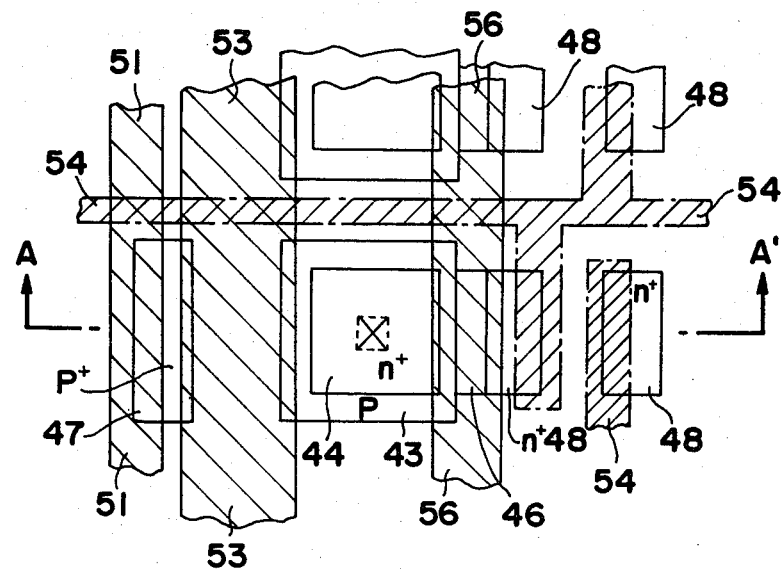
FIG. 3C is a plan view of the memory cell structure shown in FIG. 3A.
Figure 3D:
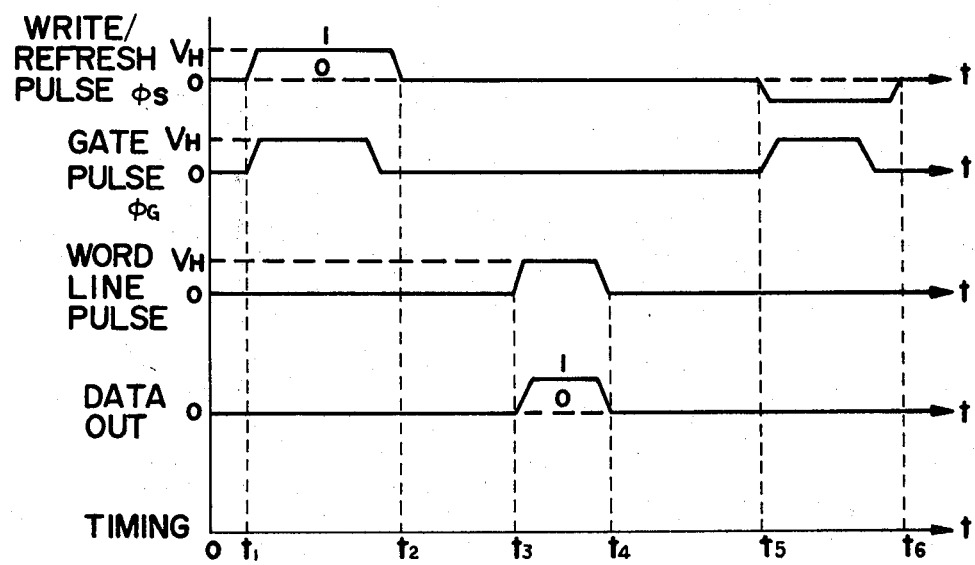
FIG. 3D is a timing chart explanatory of the operation of the memory cell shown in FIG. 3A.

FIGS. 3A, B, C and D illustrate another embodiment of the dynamic memory of the present invention, FIG. 3A being a sectional view of the dynamic memory, FIG. 3B a circuit diagram of its one cell, FIG. 3C a plan view of the memory and FIG. 3D a waveform diagram showing its operational waveforms.

In this embodiment, the write and/or refresh transistor $Q_2$ is a p-channel MOSFET (which may be a MOSSIT, too, of course,) and the readout transistor $Q_1$ is an n-channel MOSFET, too). A substrate electrode 40 is biased to a positive voltage Vs (+) and holes which are injected from a p+ type region 47 towards a p region 43 through an n type channel region 45 are mostly accumulated in a p type region 43 which is made floating. Reference numeral 41 indicates an n+ type substrate. The n type region 45 is the channel region of the write and/or refresh MOS transistor $Q_2$. In FIG. 3A, a hook structure is formed by an n+ type region 44, the p type region 43, the n− type region 42 and the n+ type region 41. The n+ type region 41 is biased to the voltages Vs (+) and the high resistivity n− region 42 is depleted in substantially the entre thickness thereof. In this state, when applying the pulse voltage $\phi_G$ to a gate electrode 53 of the write and/or refresh MOS transistor $Q_2$ to turn it on and applying the pulse voltage $\phi_S$ to a write and/or refresh line 51 to inject holes from the p+ type region 47, the holes are mostly accumulated in the p type region 43 in the abovesaid hook structure. Letting the capacitance of the junction between the n+ type region 44 and the p type region 43 be represented by $C_f$, the region 43 is positively charged by $Q/C_f$(V), where Q is the amount of charges of the holes stored in the region 43. Accordingly, the junction between the n+ type region 44 and the p type region 43 is biased in the forward direction, so that there is performed such a hook operation that electrons are injected from the n+ type region 44 into the high resistivity n− region 42 via the p type region 43. As a result of this, the n+ type region 44 is positively charged to a voltage corresponding to the depletion of electrons. This voltage is substantially equal to $Q/C_f$(V). It is sufficient to read out this voltage onto a bit line 54 by switching the readout MOS transistor $Q_1$. Reference numeral 49 indicates a burried layer of an insulator such as SiO2, SioN4 or the like, which can be formed by the SIMOX technique or monocrystallization technique using laser anneal of polysilicon on an oxide film. The n+ type region 48 is the drain of the readout MOS transistor and connected to a bit line 54. Reference numeral 55 designates a gate insulating film of the transistor $Q_1$; and 56 designates a gate electrode, which acts as a word line of the transistor $Q_1$. A region 57 is an electrode connected to the n+ type region 44 and formed of doped polysilicon. Reference numeral 58 identifies a thin insulating layer formed on the region 57 and forms a capacitance $C_S$ between it and an ground electrode line 59; and 50 and 60 denote insulators such as SiO2, PSG, PIQ or the like. FIG. 3C is a plan view corresponding to FIG. 3A, the parts corresponding to those in FIG. 3A being marked by the same reference numerals.

FIG. 3D shows timing waveforms of the pulse voltage $\phi_S$ on a write and/or refresh line 51, the pulse voltage $\phi_G$ on an address line 53, a pulse voltage on a read word line 56 and a read waveform on the bit line. The write operation is performed in the time interval between moments $t_1$ and $t_2$, the read operation between moments $t_3$ and $t_4$ and the refresh operation between moments $t_5$ and $t_6$. During the refresh operation in the time interval from the moment $t_5$ to $t_6$, by turning on the transistor $Q_2$ by the pulse signal $\phi_G$ on the address line 53 and making the pulse signal $\phi_S$ on the refresh line 51 negative, excess majority holes stored in the p type region 43 flow out therefrom into the refresh line 51. The storage operation of this embodiment is also based on the hook dtructure and the write (and refresh) transistor $Q_2$ and the readout transistor $Q_1$ are connected to the hook structure. It is desirable to select the impurity concentrations of the n+ type region 44 and the p type region 43 to be about $10^{18}$ to $10^{21}$ cm$^{-3}$ and about $10^{15}$ to $10^{17}$ cm$^{-3}$, respectively. In order to enhance the efficiency of injection of electrons from the n+ type region 44 to the p type region 43, it is preferred that the impurity concentration of the n+ type region 44 be as high as possible so long as it does not cause the band gap narrowing. For reducing $C_f$, it is desirable that the impurity concentration of the p type region 43 be as low as possible. With too low an impurity concentration of the p type region 43, however, punching-through occurs and the barrier height at the junction between the n+ type region 44 and the p type region 43 disappears. To avoid this, the impurity concentrations of the n+ type region 44 and the p type region 43 are set as mentioned above. Also in this embodiment, the voltage read out is not based on the capacitive division but the voltage of the n+ type region is provided as it is on the bit line.

Figure 4A:
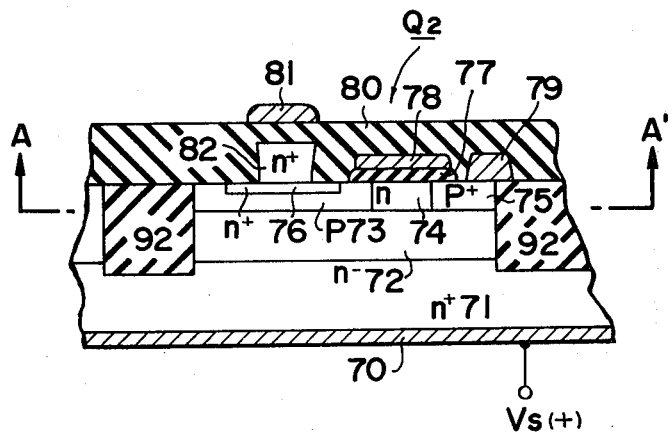
FIGS. 4A to 4C illustrate still another embodiment of the present invention.

Next, a description will be given, with reference to FIG. 4, of still another embodiment of the dynamic memory of the present invention, in which the readout transistor $Q_1$ used in the embodiment of FIG. 3 is formed substantially right above the cell. FIG. 4A shows in section this embodiment. By annealing polysilicon on an insulating film through the use of a laser to make the polysilicon monocrystalline and then doping it, an n+ type drain region 82, a p type channel region 83 and an n+ type source region 85 are formed. To an electrode 70 of an n+ type substrate 71 is applied a positive voltage $V_s(+)$. A region 72 is a high resistivity n− type layer. The thickness $l$ of the high resistivity layer 72 is selected so that its entire region is completely depleted by the bias voltage $V_s(+)$. A p+ type region 75 is the source (or drain) region of the write transistor $Q_2$ and it is connected to a write and/or refresh line 79. The impurity concentration of a p type region 73 which is held in a floating state is selected to range from about $10^{15}$ to $10^{18}$ cm$^{-3}$. The impurity concentration of an n+ type region 76, which is similarly held in a floating state, is selected to be approximately $10^{19}$ to $10^{21}$ cm$^{-3}$. The region 82 is connected to the n+ type region 76 and forms the drain (or source) region of the readout transistor $Q_1$. Reference numeral 81 indicates a gate electrode of the readout transistor $Q_1$, which serves as a word line, too; 92 designates isolation region; and 77 and 86 identify gate insulating films of the transistors $Q_2$ and $Q_1$. The region 85 acts as the source (or drain) region of the readout transistor $Q_1$ and it is connected to a bit line 84 which is formed of doped silicon or a silicide of a refractory metal such as tungsten, molybdenum or the like.

Figure 4B:
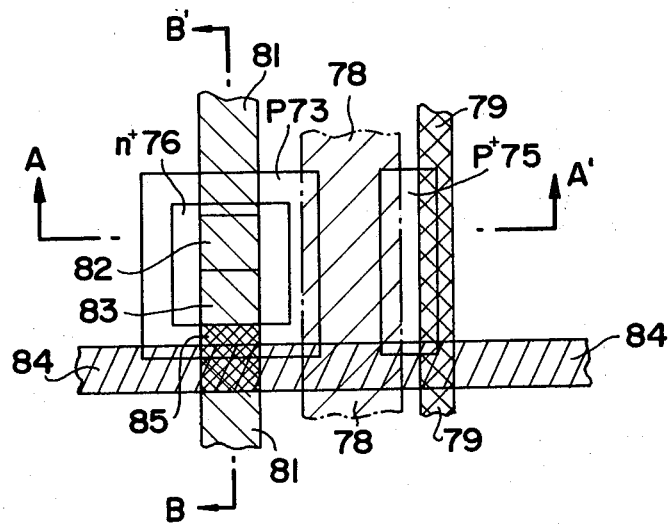
Figure 4C:
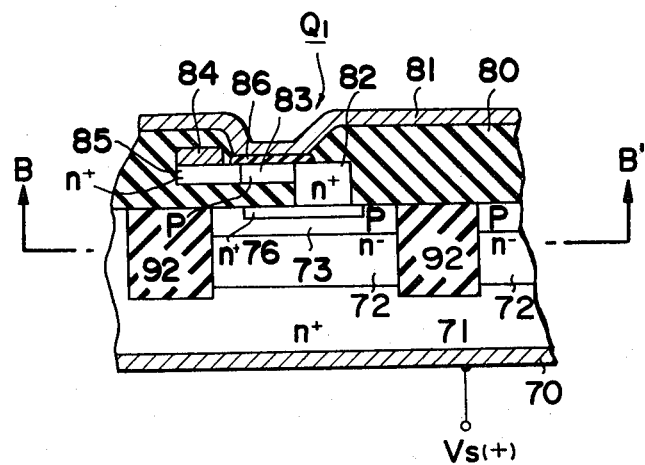
Figure 4D:
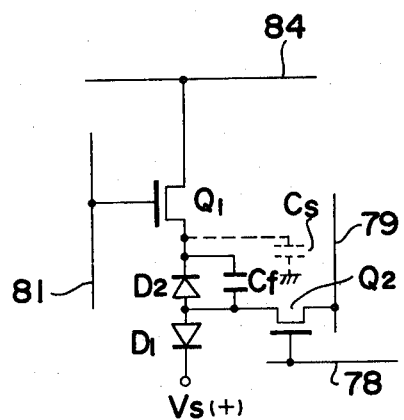
FIG. 4D is a circuit diagram of one cell portion of the memory cell shown in FIGS. 4A to 4C.

An n type region 74 is the channel of the write and/or refresh MOS transistor $Q_2$. FIG. 4B is a plan view of the dynamic memory depicted in FIG. 4A which is a sectional view taken on the line A—A' in FIG. 4B and FIG. 4C a sectional view taken on the line B—B' in FIG. 4B. FIG. 4D shows a circuit diagram of one cell. Variations in the pulse voltage $\phi_S$ on the write and/or refresh line 79, the pulse voltage $\phi_G$ on the gate (an address line 78) of the write and/or refresh transistor $Q_2$ and potentials on the word line 81 and the bit line 84 are the same as those depicted in FIG. 3D. In FIG. 4, an n+ type region 76, the p type region 73, the n− type region 72 and an n+ type region 71 make up the hook structure.

The above has described embodiments of the present invention in conjunction with FIGS. 2 to 4; the following will describe important features of the invention.

The dynamic memory of the present invention permits a non-destructive readout operation. The memory operation of the dynamic memory is performed as follows: The hook structure, which is formed by the $n_1+$-p-n$^-$-$n_2+$ arrangement (the conductivity type of which may be reverse therefrom, too and in which the $n_1+$ type and the p type regions are held in the floating state, is designed so that when the positive bias voltage $V_s(+)$ is applied to the $n_2+$ type region, a depletion layer may extend entirely in the widthwise direction of the high resistivity n− type layer. In this state, holes are injected from the write transistor $Q_2$ and stored in the p type region and, by the stored holes, the junction between the $n_1+$ type region and the p type region is biased in the forward direction, in consequence of which electrons are drawn out from the $n_1+$ type region to charge it positive. At the same time, since the p type region is held in the floating state, excess majority holes injected from the write transistor $Q_2$ are stored in the p type region. This memory information is stored until the excess majority holes in the p type region are extinguished in the generation-recombination process; this is several tens of seconds at room temperature, and hence a dynamic memory operation is obtained. For the readout operation, it is sufficient to take out the positive voltage of the $n_1+$ region onto the bit line via the readout switching transistor $Q_1$. During the read operation, when the readout transistor $Q_1$ is turned on by the word-line pulse, electrons flow into the $n_1+$ region but, since holes are held in the p type region, the electrons having flowed into the $n_1+$ type region immediately flow out therefrom into the high resistivity layer via the p type region, permitting the $n_1+$ type region to return to its original charged state. Accordingly, the readout operation becomes non-destructive. As the readout voltage from the memory cell of the present invention, the positive voltage of the $n_1+$ type region is provided remaining substantially unchanged and its value is nearly equal to $Q/C_f$, where $Q$ is the amount of charges of the holes stored in the p type region and $C_f$ is the capacitance of the junction formed between the $n_1+$ type region and the p type region. Consequently, the voltage to be read out can be increased by decreasing the junction capacitance $C_f$. This means that, by reducing the junction capacitance $C_f$ and minimizing the cell area, the voltage to be read out is increased by that. This is entirely opposite to the conventional one-transistor one-capacitor type memory in which a decrease in the cell area causes a decrease in the storage capacitance $C_S$ and the signal output is reduced by the capacitive division with the bit line capacitance $C_B$ as follows:

$$\frac{Q}{C_S + C_B} = \frac{C_S}{C_S + C_B} V_{st}$$

where $V_{st}$ is the voltage of the storage capacitance $C_S$, so that $C_S/C_B$ must be made large in order to increase the read-out voltage. In the dynamic memory of the present invention, however, since the readout is the non-destructive one utilizing the hook structure, the value of $C_S/C_B$ has a little bit influence on the read-out voltage. That is, the voltage which occurs on the bit line is approximately $Q/C_f$ in absolute value and, taking into account the time constant during the read-out process, the voltage D(t) on the bit line is substantially as follows:

$$D(t) \approx \frac{Q}{C_f}\left(1 - e^{-\frac{t}{R_B C_B}}\right)$$

where $R_B$ is the resistance of the read-out switching transistor $Q_1$ when it is in the On state. This resistance can easily be made very small by sing, for example, a MOSSIT or J-SIT as the switching transistor $Q_1$ and the time constant $R_B C_B$ can easily be set to 1 n sec or less. Since the prior art three-transistor cell type memory of non-destructive readout has a difficulty in increasing its capacity, the memory of the present invention is substantially equal to the packing density of the one-transistor cell type memory using two-layer polysilicon or a stacked high capacitor type. In the present invention, if the cell area is further decreased, then $C_f$ is reduced and the output voltage is further increased, whereas in the conventional one-transistor cell type memory, a decrease in the cell area decreases the storage capacitance $C_S$ and the output voltage, resulting in the burden on the sense amplifier becoming large.

The sensistivity of the output voltage of the dynamic memoru of the present invention is approximately $(C_S + C_B)/C_f$ times higher than that of the prior art one-transistor cell type memory. Even if it is assumed that $C_B > C_S \approx C_f$, the sensitivity of the memory of the present invention is about $C_B/C_f$ times higher than that of the conventional one-transistor cell type memory, where $C_S$ is the storage capacitance of the conventional one-transistor cell type memory and $C_f$ is substantially equal to the capacitance of the junction formed between the n+ type region and the p type region of the hook structure of the memory cell in the present invention. The assumption that $C_S \approx C_f$ is appreciably severe to the memory cell of the present invention although the capacitance decreases substantially in proportion to the cell area (for the one-transistor one-capacitor type memory is designed so that the storage capacitance $C_S$ may be as large as possible compared to the decrease in the cell area); nevertheless, the sensitivity of the memory of the present invention is approximately $C_B/C_f$ times higher than that of the prior art memory.

Unlike the conventional memories of the type using a capacitor as a mere storage capacitance, the dynamic memory of the present invention makes use of the hook structure and has an internal amplifying action and is read out non-destructively; accordingly, the memory of the present invention lighten the burden which is required of a highly sensitive sense amplifier of a valanced flip-flop type, simplifies peripheral circuit arrangements and increases the output voltage with a decrease in the parasitic junction capacitance $C_f$ in the hook structure. The dynamic memory of the present invention becomes more and more advantageous from the viewpoint of increasing the capacity as the device is miniaturized.

When holes are accumulated in the floating p type region, electrons are injected thereinto from the floating n+ type region adjacent thereto and flow out into the high resistivity region, thereafter being absorbed by the substrate electrode; in this case, the holes stored in the p type region also tend to flow out therefrom into the adjoining n+ type region. In order to facilitate the outflow of the electrons from the n+ type region but prevent the holes from flowing out of the p type region it is sufficient to grade the impurity distributions in the n+ type and the p type region. In the p type region, the impurity distribution is set up so that the impurity concentration decreases as the distance from the junction plane between the p type and the n+ type region increases, whereas in the n+ type region, the impurity distribution is set up so that the impurity concentration increases as the distance from the junction plane between the n+ type and the p type region increases. With such impurity distributions, the electrons having entered the p type region flow into the high resistivity region, accelerated by a drift electric field, but the holes having entered the n+ type region are driven back by a deceleration field. The electric field intensity E, for example, in the case of the impurity concentration being distributed just like an exponential function, is given by $$E = \frac{kT}{q} \cdot \frac{1}{W} \ln \frac{N_2}{N_1}$$

where k is the Boltzmann's constant, T is temperature, $N_2$ is the impurity concentration in the junction plane and $N_1$ is the impurity concentration at a place spaced a distance W apart from the junction plane. When $N_2/N_1 = 100$, if $W = 0.5$ μm, then $E = 2.4 \times 10^3$ V/cm at room temperture; if $W = 1$ μm, then $E = 1.2 \times 10^3$ V/cm. For example, in the n+ type region, the impurity concentration is held at about $1 \times 10^{19}$ cm$^{-3}$ in the junction plane and it is increased up to about $1 \times 10^{21}$ cm$^{-3}$ as the distance from the junction plane increases. In the p type region, the impurity concentrationn is held at about $1 \times 10^{17}$ cm$^{-3}$ in the junction plane and it is decreased down to about $1 \times 10^{15}$ cm$^{-3}$ as the distance from the junction plane increases. The difference between the impurity concentrations $N_1$ and $N_2$ is not limited specifically to 100 but may be larger or smaller than 100. The point is to facilitate flowing out of electrons from the n+ type region but prevent flowing out of holes from the p type region. It is also effective for this purpose to increase the impurity concentration of the n+ type region and to decrease the impurity concentration of the p type region.

The memory of the present invention which is capable of non-destructive readout can be employed not only as a digital memory for storing binary information "1" and "0" but also as an analog memory for storing analog information. In the case of the analog memory, the amount Q of excess majority holes which are stored in the floating p type region is the analog quantity being written. In the memory of the present invention, the readout voltage on the bit line is approximately given by the ratio $Q/C_f$ between the electrostatic capacitance $C_f$ of the floating junction defined by the n+ type and the p type region and the amount Q of written excess majority holes substantially regardless of the capacitance $C_S$ of the floating n+ type region and the bit line capacitance $C_B$.

Because of no signal attenuation by the capacitive division during the readout process, it is possible to lighten the burden on the sense amplifier for detecting the amount of analog signal.

The memory of the present invention is a little complicated in the cell structure but is of particular utility when employed as an analog memory for the above reason.

By applying the semiconductor memory of the present invention to peripheral circuits of a semiconductor image sensor disclosed in our prior Japanese Patent Application Nos. 60316/1980 and 54001/1980, a buffer memory for output to the outside can be formed by substantially the same process as that for the cell portion of the image sensor; accordingly, the function of the image sensor can further be enhanced.

It will be apparent that many modifications and variations may be effected without departing from the scope of the novel concepts of the present invention. The n+ regions 41 and 71 in FIGS. 3 and 4 are the substrate. These n+ regions can be constructed the buried region in the p type substrate.

What is claimed is:

1. A semiconductor memory which is provided with a memory cell comprising;
    a hook structure composed of a first region of a first conductivity type, a second region of said first conductivity type, a third region of a second conductivity type reverse from the first conductivity type and a fourth region of said first conductivity type, the first to fourth regions being sequentially formed on a semiconductor substrate and the third and fourth regions being made floating;
    a write and/or refresh transistor using the third region of the hook structure as one of its main electrode regions; and
    a readout transistor using the fourth region of the hook structure as one of its main electrode regions.

2. A semiconductor memory according to claim 1 wherein the fourth region of the hook structure contains an impurity of higher concentration than does the third region.

3. A semiconductor memory according to claim 2 wherein the fourth region of the hook structure has such an impurity concentration distribution that the impurity concentration increases as the distance from the interface with the thid region increases.

4. A semiconductor memory according to claim 2 wherein the third region of the hook structure has such an impurity concentration distribution that the impurity concentration decreases as the distance from the interface with the fourth region increases.

5. A semiconductor memory according to claim 1 wherein a plurality of such cells are arranged in the form of an array in a single substrate.

6. A semiconductor memory according to claim 1 wherein the first region is the semiconductor substrate.

* * * * *